(12) United States Patent
Achammer et al.

(10) Patent No.: US 7,134,554 B2
(45) Date of Patent: Nov. 14, 2006

(54) CONNECTOR PACKAGING AND TRANSPORT ASSEMBLY

(75) Inventors: Daniel G. Achammer, Warrenville, IL (US); Wilfred Wolf, Park Ridge, IL (US); James A. Wetter, Schaumburg, IL (US)

(73) Assignee: Molex Incorporated, Lisle, IL (US)

( * ) Notice: Subject to any disclaimer, the term of this patent is extended or adjusted under 35 U.S.C. 154(b) by 150 days.

(21) Appl. No.: 10/979,018

(22) Filed: Nov. 1, 2004

(65) Prior Publication Data

US 2005/0090126 A1 Apr. 28, 2005

(51) Int. Cl.
*B65D 85/00* (2006.01)

(52) U.S. Cl. .................... 206/725; 206/480

(58) Field of Classification Search ........... 206/722, 206/724, 725, 726, 714, 716, 560, 564, 480
See application file for complete search history.

(56) References Cited

U.S. PATENT DOCUMENTS

| | | | |
|---|---|---|---|
| 3,795,037 A | 3/1974 | Luttmer | |
| 3,954,317 A | 5/1976 | Gilissen et al. | |
| 4,008,300 A | 2/1977 | Ponn | |
| 5,348,489 A | 9/1994 | Yeh | |
| 5,385,477 A | 1/1995 | Vaynkof et al. | |
| 5,403,194 A | 4/1995 | Yamazaki | |
| 5,540,593 A | 7/1996 | Takahashi | |
| 5,808,874 A | 9/1998 | Smith | |
| 5,913,687 A | 6/1999 | Rathburn | |
| 6,280,207 B1 | 8/2001 | Sakata et al. | |
| 6,315,576 B1 | 11/2001 | Neidich | |
| 6,350,138 B1 | 2/2002 | Atobe et al. | |
| 6,447,308 B1 | 9/2002 | McCarthy et al. | |

FOREIGN PATENT DOCUMENTS

| | | |
|---|---|---|
| EP | 0573147 A1 | 12/1993 |
| EP | 1150390 A1 | 10/2001 |

OTHER PUBLICATIONS

International Search Report for counterpart International Application No. PCT/US2003/016726.

*Primary Examiner*—Shian T. Luong
(74) *Attorney, Agent, or Firm*—Thomas D. Paulius

(57) ABSTRACT

A connector-transport assembly for holding and transporting a electronic component includes a socket connector having a receptacle sized to receive the component therein and a transport carrier member. The socket receptacle includes two engagement arms formed therewith which are deflectable between first and second operative positions. In the first operative position, the engagement arms extend into the receptacle for contacting opposing exterior surfaces of the component, and in the second position the engagement arms are deflected away from the receptacle so as to not engage exterior surfaces of the component. The engagement arms have cam portions disposed thereon, and the carrier member includes actuating members disposed thereon in opposition to the socket connector engagement arm cam portions so that movement of either the socket connector or the carrier member will move the engagement arms between their first and second operative positions to release or engage the electronic component.

11 Claims, 9 Drawing Sheets

FIG. 13

CONNECTOR PACKAGING AND TRANSPORT ASSEMBLY

REFERENCE TO RELATED APPLICATIONS

This application claims priority from prior U.S. provisional patent application No. 60/383,567, filed May 28, 2002.

BACKGROUND OF THE INVENTION

This invention relates to generally electrical connectors, and more particularly, to a connector packaging assembly and method for the mounting of an electrical component on a connector and transportation of the connector and mounted component.

Connectors are used for a number of applications, In one such application that occurs commonly in the computer area, a computer chip or similar electronic component is placed into a socket connector and then transported to an assembly location where the socket and chip are installed upon a circuit board. The socket connector may have a receptacle area for receiving the chip therein and also may incorporate resilient beam members for securing the chip, or component to the connector. When the component is placed into the socket, it may contact with the connector beam members, causing them to deflect and allowing the component to be seated into the connector receptacle area. After the component is fully seated, the beam members return to their undeflected states, thereby securing the component to the connector. The connector beam members in such a connector are used to align the chip and hol dit in place in the socket connector.

One problem with these type mechanisms is that moving contact between the component and the connector during the mounting operation may cause the component to abrade the connector housing material, creating unwanted debris which may interfere with electrical contact between the component and the connector, or which may interfere with later manufacturing processes. It has been found difficult to formulate a connector housing material which will both satisfy the rigid dimensional requirements imposed by connector miniaturization and resist the abrasion encountered during mounting of electrical components. Another, ongoing problem is damage to connector terminals during shipping and handling.

Typically, the chip or component is placed into the socket connector either manually or robotically. In either instance, the beam members must be deflected outwardly so that the chip may enter and seat within the socket and then they return back into contact with the exterior surfaces of the chip to hold it in place. It is desirable to do this process in an automated manner with a mechanism that actuates the beam members into and out of engagement with the chip edges, and which is incorporated in a structure that also provides a protective transport assembly for the chip and its socket connector.

The present invention is directed to such an assembly which overcomes the aforementioned disadvantages.

SUMMARY OF THE INVENTION

Accordingly, it is a general object of the present invention to provide a socket connector for receiving a chip therein which has a chip-securing means integrated into its structure and which is operate by automated means.

Another object of the present invention is to provide a connector-carrier assembly for receiving an electronic component within a connector and for holding the connector in place upon a transport carrier, the transport carrier having actuating means formed therewith for actuating one or more component engagement members formed with the connector, such that movement of the connector upon the transport carrier, actuates the component engagement members to engage or disengage the component.

A further object of the present invention is to provide a connector-transport assembly for holding and transporting a electronic component, the assembly including a socket connector having a receptacle sized to receive a component therein, the receptacle including at least two engagement arms that are formed therewith and which are deflectable between first and second operative positions, wherein in the first operative positions, the engagement arms extend into the receptacle for contacting opposing exterior surfaces of the component and in the second position, the engagement arms are deflected away from the receptacle so as to not engage exterior surfaces of the component, the engagement arms having cam portions disposed thereon, and a carrier member that supports the socket connector in a transport orientation thereon, the carrier member having actuating members that are disposed thereon in opposition to the socket connector engagement arm cams so that movement of either the socket connector or the carrier member will move the engagement arms between their first and second operative positions.

Yet another object of the present and as exemplified by another embodiment thereof is to provide a socket-style connector having a receptacle for receiving an electronic component therein, the receptacle having a plurality of terminal-receiving passages, each of which receives a conductive terminal therein, the terminals being held in place within their cavities by a elastomeric substance such as a silicone rubber, the bottom surface of the socket connector defining a surface for dispensing the elastomeric substance during assembly, the dispensing surface being separated from the rest of the connector by way of a channel that extends around the dispensing surface and separates it from sidewalls of the connector, the dispensing surface having a hard edge where it meets the channel, the edge forming a barrier to liquid elastomers disposed onto the dispensing surface.

These objects are performed by means of the structure of the present invention. In one aspect of the present invention, a conventional socket connector that has a plurality of engagement arms formed therewith has is modified to include openings adjacent the engagement arms. The engagement arms have cam surfaces provided on them that extend through the openings of the socket connector. In another aspect, the socket connector is modified to include a number of positioning surfaces in the receptacle portion thereof, against which the electronic component abuts.

In still another aspect of the present invention, a liquid dam is provided along the bottom surface of the connector by forming a hard, unbroken edge that is spaced apart from the sides of the socket connector. The bottom surface of the connector may be considered as a dispensing surface, upon which a liquid sealant is dispensed during assembly of the connector. This continuous edge contains liquid sealants, such as silicone that may be dispensed onto the bottom surface of the connector for sealing the conductive contacts of the socket connector in place in contact-receiving passages of the connector. Surface tension keeps the liquid from moving past the edge of the connector into other parts of the connector.

In yet another aspect of the present invention, a carrier member is provided to support the socket connector and actuating members are formed in the surfaces thereof which oppose the cam surfaces formed on the socket connector engagement arms. When either the socket connector or the carrier member are moved relative to each other, the cam surfaces of the engagement arms contact the actuating members of the carrier member and they are preferably drawn into an open position where they are deflected away from the socket connector receptacle, thereby opening the socket connector receptacle for insertion of an electronic component therein. Relaxation of the movement results in the cam surfaces being separated from their associated actuating members and the engagement arms will typically deflect back into the receptacle, thereby gripping the edges of any component resident in the socket connector receptacle. The engagement arms hold the component in place on the carrier member, and the connector-carrier member assembly may be used to transport the component without damage.

The socket may be constructed with a reaction surface that an assembler may press to move the socket connector upon the carrier member. In an alternative embodiment, a hinge member may be formed as part of the carrier member that serves as the reaction surface against which an assembler pushes. Pushing on either reaction surface moves the socket connector on the carrier member and causes the engagement arms to engage the actuating members of the carrier members to thereby cam the engagement arms outwardly to open up the socket receptacle for insertion of an electronic component into its receptacle These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which.

DETAILED DESCRIPTION OF THE PREFERRED EMBODIMENTS

Figure 1:
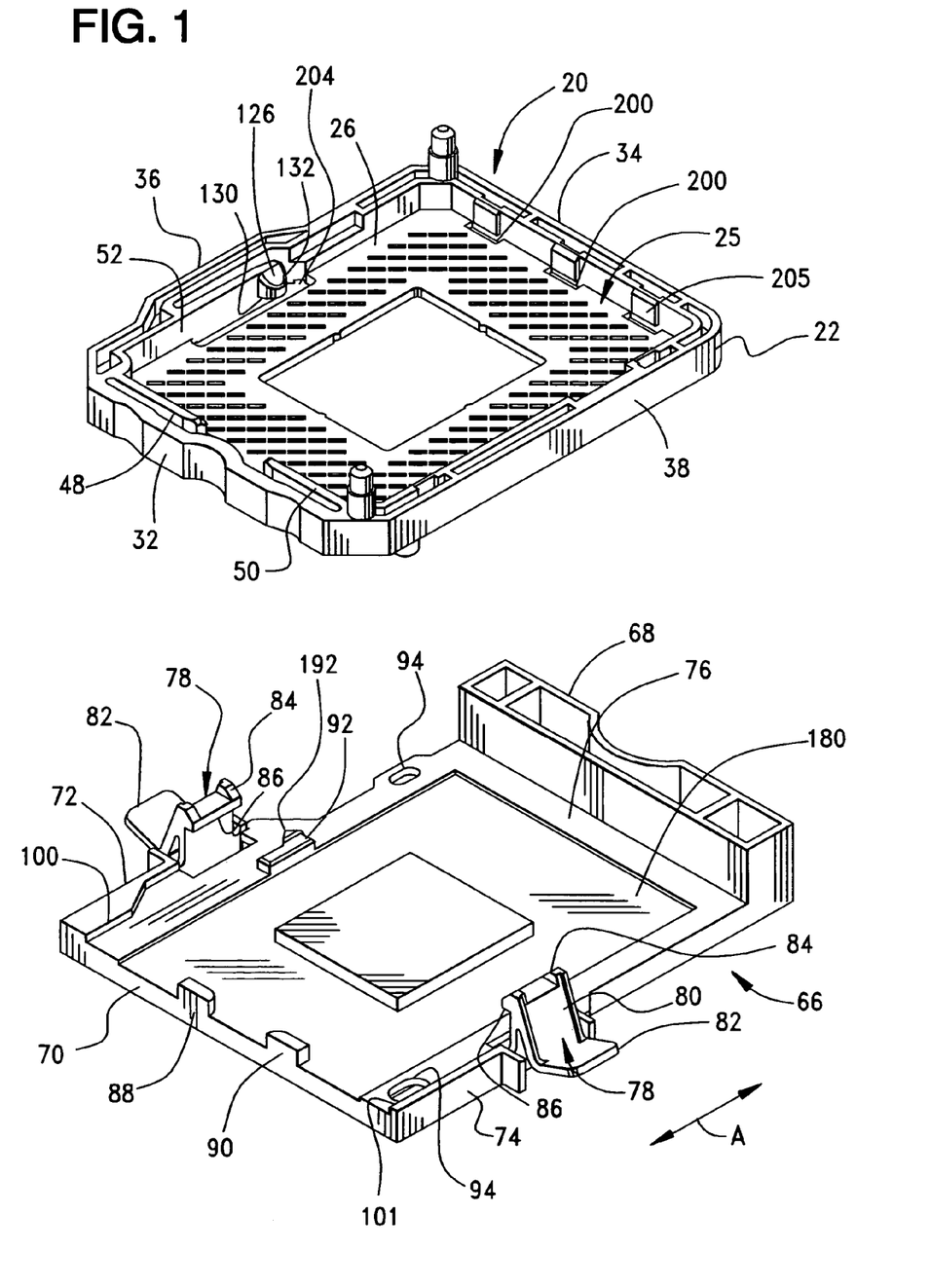
FIG. 1 is a perspective view of one embodiment of a connector and a packaging carrier constructed in accordance with the principles of the present invention.
Figure 2:
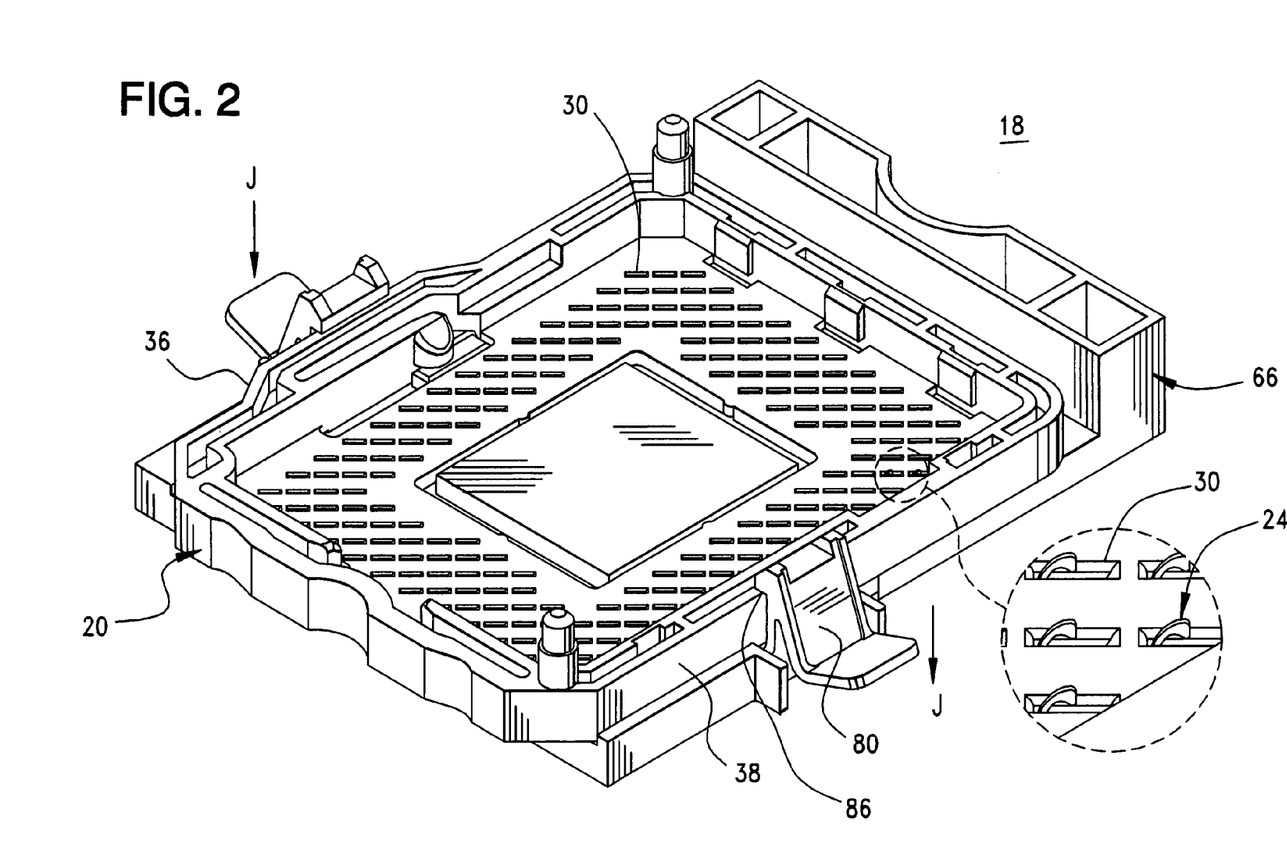
FIG. 2 is a perspective view showing the connector mounted to the packaging carrier of FIG. 1.
Figure 3:
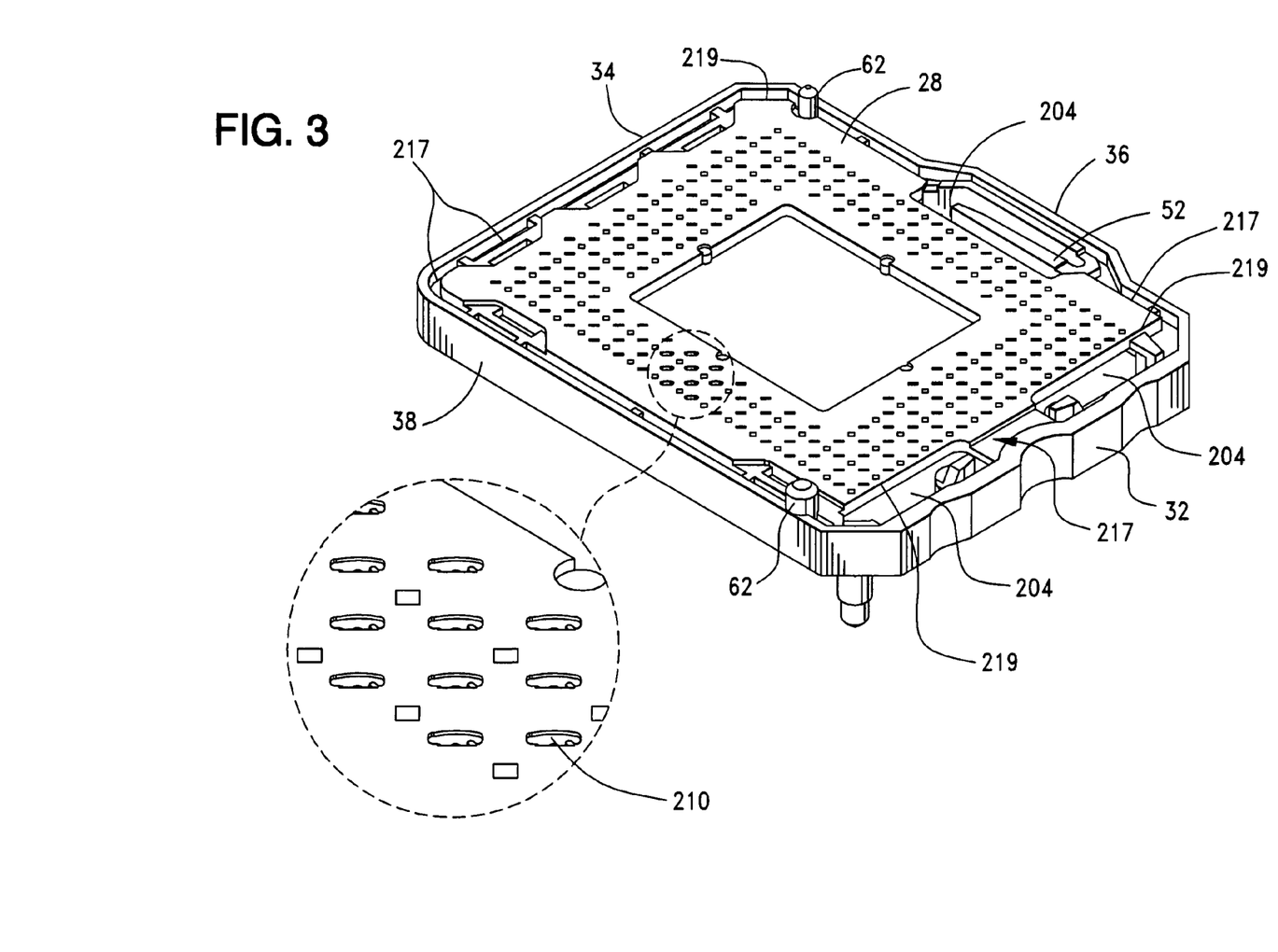
FIG. 3 is a perspective view of the connector shown in FIG. 1 showing the connector mounting face (bottom) of the connector.
Figure 4:
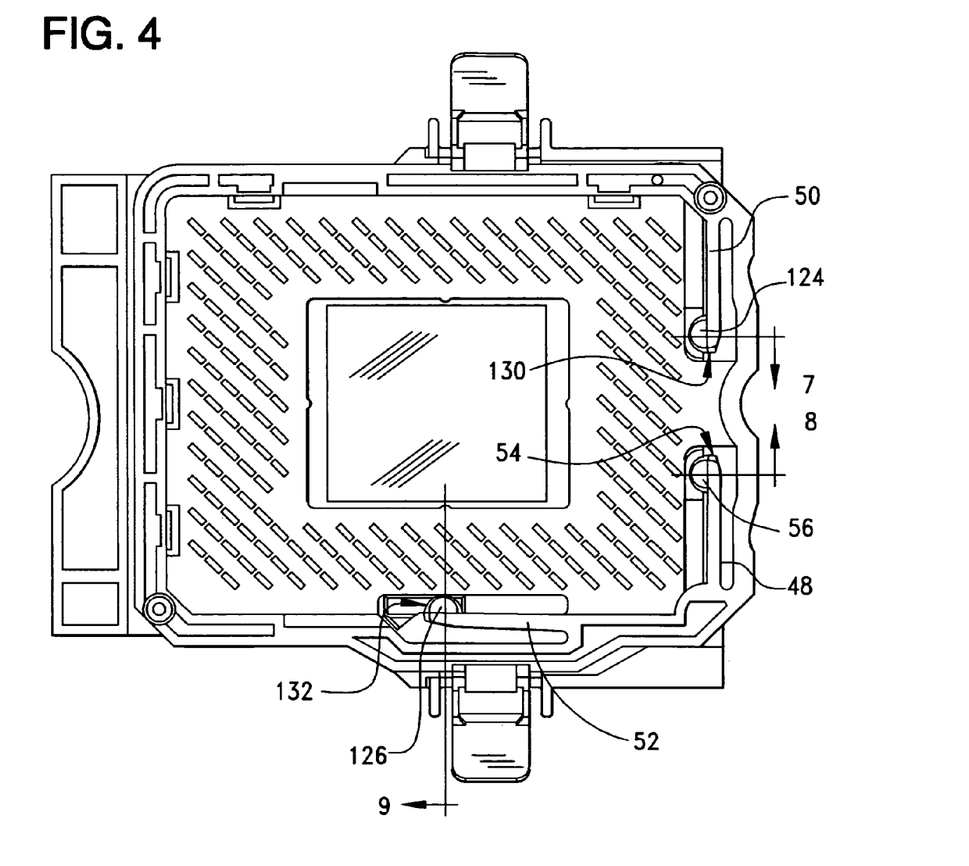
FIG. 4 is a top view of the connector mounted to the packaging carrier as seen in FIG. 2, showing the connector beam members in an undeflected state.

Referring first to FIGS. 1 and 2, a connector packaging assembly 18 is seen to include a packaging plate, or carrier 66, and an electrical connector 20, that takes the form of a socket connector. The connector 20 has a generally rectangular dielectric housing 22 (although other configurations may be used) and a plurality of conductive terminals 24 mounted in the housing 22. The housing 22 comprises a base portion 25 with a plurality of walls projecting upwardly from base portion 25. The base portion 25 includes a component mounting surface 26, a connector mounting surface 28 and an array of terminal receiving cavities 30 formed in the base portion 25 which extend between the component mounting surface 26 and connector mounting surface 28. A first end wall 32, a second end wall 34 and a pair of opposed side walls 36, 38 project from base portion 25, generally circumscribing component mounting surface 26 to define a receptacle 40 for receiving an electrical component therein. As shown in FIG. 3, a pair of recesses 44 are formed between first end wall 32 and base portion 25. An additional recess 46 is formed between side wall 36 and base portion 25.

Figure 1A:
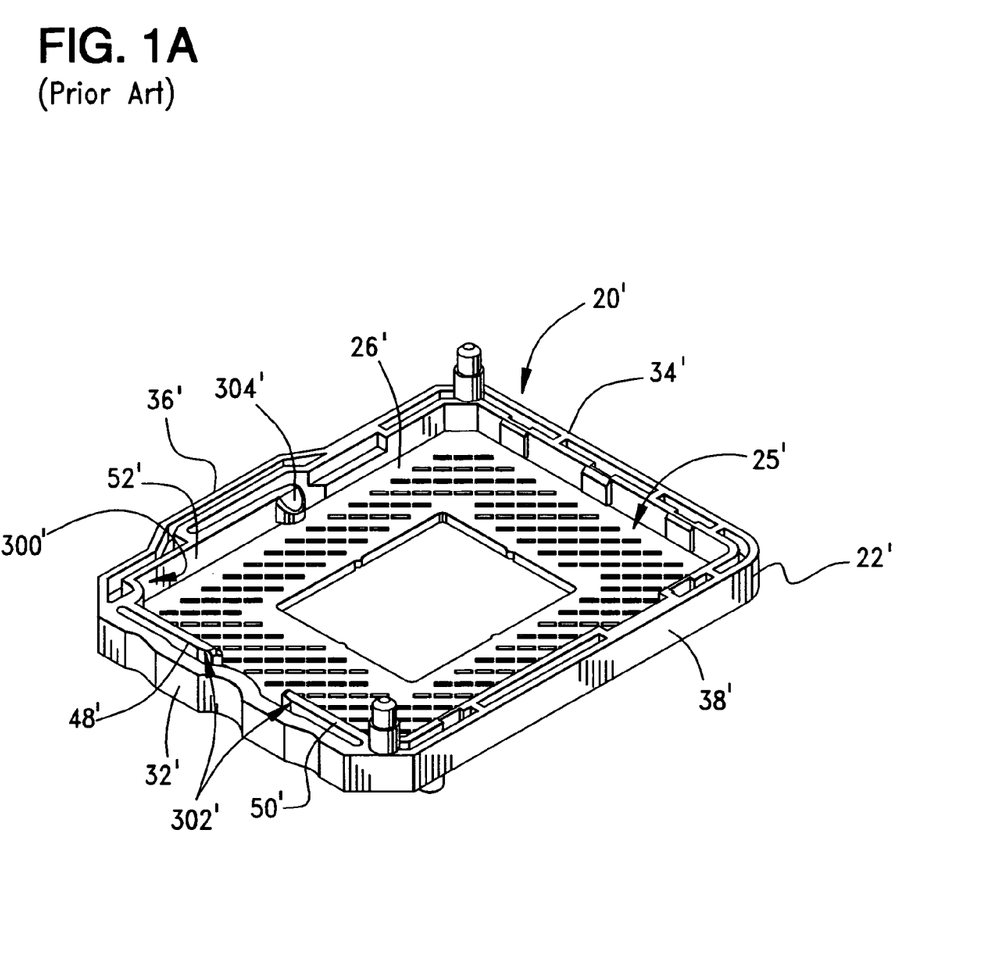
FIG. 1A is a perspective view of a known socket connector.

FIG. 1A illustrates a conventional socket connector 20' that is used to hold an electronic component such as a chip. The socket 20' has a housing 22' with a base 25' and an interior receptacle 40' formed by the cooperation of a plurality of raised walls 32, 34, 36, 38. A series of cavities 30' are formed in the housing 22' and each such cavity receives a conductive terminal therein. In order to hold the electronic component in the receptacle 40', the connector 20' is provided with a plurality of engagement arms 48', 50', 52' that are disposed along two distinct (and adjacent) interior walls 300' of the receptacle 40'. These engagement arms take to form of cantilevered beam members which are fixed at one end thereof and which are free at the other end 302' thereto so that the overall engagement arms are deflectable structures. The engagement arms may be provided with enlarged end portion 304' that extend toward the receptacle 40' and which will abuttingly engage an opposing surface of the component when it is placed in the receptacle 40'.

Returning to FIG. 1 which shows a connector 40 that has been modified to incorporate the principles of the present invention, a plurality of openings 200, 204 have been made in the base 25 of the housing 22, and specifically in the base portion 25 of the receptacle. The first openings 200 are disposed adjacent to a series of standoffs 205 that are shown formed as part of wall 34, but which are also preferably disposed on adjacent wall 38. These openings permit inspection of the seating of the component or chip within the receptacle by automated and visual means. The second openings 204 are disposed in the base portion 25 adjacent to the engagement arms 48, 50, 52 and portions of the engagement arms may extend into the openings 204 as shown with the bottom of engagement arm 52. The purpose of these openings shall be come more apparent in the explanation which follows.

In FIG. 1, the engagement arms of the socket connector 20 are illustrated as cantilevered beam members 48, 50 and 52. First and second beam members 48, 50 are shown projecting from first end wall 32 along openings 204 intermediate base portion 25 and first end wall 32. Also, a third beam member 52 projects from an adjacent side wall 36 along a corresponding opening 204 intermediate base portion 25 and side wall 36. (FIG. 3.) In the described embodiment, the engagement arm beam members 48, 50 and 52 each have a cantilevered structure. The engagement arm beam members 48, 50 and 52 may alternatively be supported at two ends with a retention stub, as described, below positioned intermediate the supported ends.

As seen in FIGS. 4 and 7–9, the engagement arm beam members 48, 50 and 52 have enlarged ends, or contact stubs 54, 130 and 132, respectively, projecting from free ends of the engagement arms. These enlarged ends 48, 50 and 52 have first sloped sides 56, 124 and 126, respectively, sloping toward component mounting surface 26 and second sides 58, 128, 130 opposite the first sides, with each second side defining a clearance shoulder that clears the actuating members 88, 90, 92 formed as part of the carrier member. These shoulders, in effect, define notches that contain internal cam surfaces 60, 110, 112, which oppose the actuating members 88, 90, 92 of the carrier member 66 when the socket connector is in place on the carrier member 66. As seen best in FIG. 3, a pair of guide posts 62 extend downwardly from the connector mounting surface 28 for insertion into a corresponding pair of elongated guide post cavities 94 formed in the carrier member 66, in a manner to be described later.

Figure 5:
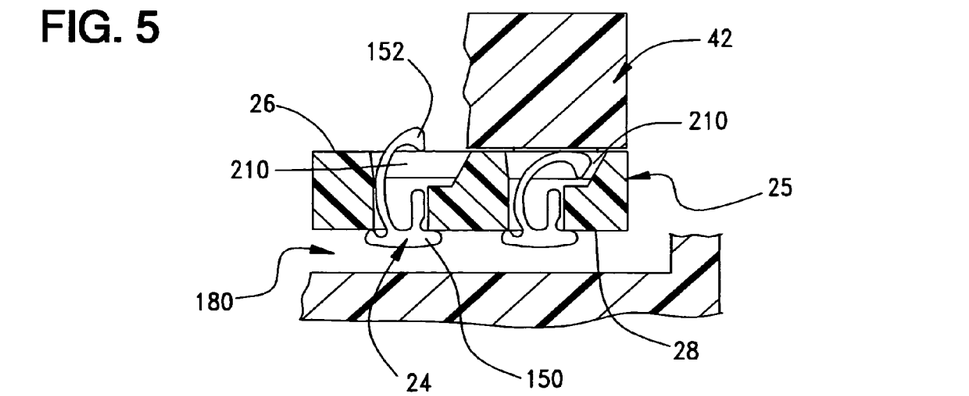
FIG. 5 is a cross-sectional view of the connector of FIG. 1 showing the configuration of the terminals mounted in their terminal-receiving cavities.

Referring now to FIGS. 2 and 5, an electrically conductive terminal 24 is mounted in each of the terminal-receiving cavity 210. The terminals 24 may have any configuration suitable for insertion and securement into the terminal receiving cavities and the terminals may be secured within the cavities using any suitable method. In the present embodiment, the terminals 24 are of an LGA-type, meaning that they are configured so that contact portions 152 of the terminals 24 extend above the component mounting surface 26 and that base portions 150 extend below the connector mounting surface 28 of the connector 20 to contact respective contact pads of an electronic device, such as a circuit board 215. The terminals 24 are positioned within receiving cavities 30 and encapsulated therein by application of a suitable medium that has insulative properties and adhesive properties to hold and retain the terminals 24 in place within their corresponding cavities 210.

A conventional such medium that is used in these type applications is a liquid silicone rubber, which is poured onto the connector 20 and which flows into the portions of the cavities 210 that are between the terminals 24 and the surrounding connector housing and then is permitted to cure to hold the terminals 24 in place in the connector 20. In order to facilitate the application of this liquid medium and to prevent it from going astray during the application process, as illustrated best in FIG. 3, the connector base portion 25 and its surrounding walls are preferably integrally formed as a single piece. A moat, or recess, 217 is provided along the perimeter of the bottom mounting surface 28 which extends completely around the base portion 25 of the connector and which serves to space the base portion 25 apart from the various sidewalls 32, 34, 36, 38. In so doing, the base portion 25 is provided with a hard perimeter edge 219 ("hard" meaning a right angle or its equivalent and excluding rounded and sloped surfaces) that forms a virtual dam which substantially prevents the migration of the silicone (or other liquid) into the moat by way of surface tension and the like. The liquid silicone is usually poured onto the bottom surface and it flows along the surface until it comes into contact with the hard edge where its surface tension prevents the liquid from falling over the edge into the moat.

Referring to FIGS. 1 and 5, a cavity 180 is formed in packaging plate 66 which extends below plate connector mounting surface 76. When connector 20 is mounted on packaging plate 66, terminal base portions 150 reside within cavity 180. Cavity 180 has a depth extending below connector mounting surface 76 sufficient to ensure clearance between terminal base portions 150 and the cavity bottom such that terminals base portions 150 will not come into contact with the cavity bottom when connector housing 22 abuts plate connector mounting surface 76.

Referring to FIG. 1, it cam be seen that the packaging carrier 66 has a first (rear) end 68, a second (front) end 70, a pair of opposed ends 72, 74 and a connector carrying surface 76. A latch member 78 is located along each of opposed sides 72, 74 for securing the connector 20 to the carrier plate 66 in a manner to be described in more detail later. Each latch member 78 has a body 80 and an actuating tab 82 projecting from the body 80. The latch member body 80 includes lead-in portions 84 and a retention ledge 86.

Cam blocks or actuating members 88, 90, 92 are provided as part of the carrier plate 66 and project upwardly therefrom from pre-defined locations on the connector support surface 76 thereof. Cam blocks 88, 90, 92 are configured to engage corresponding engagement surfaces 60, 110, 112 that are formed on the engagement arm beam members 48, 50, 52, respectively, in a manner to be described later. The two actuating members 88 and 90 are shown as upright posts or the like, while the other actuating member 92 is shown in the form of a longitudinal rail with an actuating head 192 formed at one end thereof. These actuating members fit within the notches defined in the large ends of the engagement arms as explained above. A pair of elongated guide post cavities 94 are formed in the carrier plate support surface and are configured to receive corresponding guide posts 62 that are formed with and extend down from the connector housing 22 in a clearance fit therein. The elongated configuration of the cavities 94 permits movement of guide posts 62 therein along the reciprocal directions indicated by the arrow "A".

The carrier plate 66 may further include one or more walls 100, 101 extending from the 4 plate connector support surface 76. The shapes of the carrier plate walls 100, 101 substantially correspond to the shapes of outer portions of respective connector side walls 36, 38 such that packaging plate walls 100, 101 aid in guiding the movement of the socket connector 20 in the direction "A" along the plate connector support surface 76, in the manner described below.

The method of securing connector 20 to the carrier plate 66 will now be described. As shown in FIG. 1, the socket connector 20 is first spaced apart from the support face 76 and is oriented with respect to therewith such that connector housing second end wall 34 is opposed to the support plate first end 68. With the connector 20 in this orientation, the guide posts 62 are positioned opposite, and within guide post cavities 94.

From this position, the connector 20 is then urged toward the carrier plate support surface 76. As connector 20 approaches the carrier plate 66, the connector side walls 36, 38 abut the lead-in portions 84 of the latch members 78, forcing the latch member bodies 80 to resiliently deflect away from the connector 20. Also, as the connector 20 approaches the carrier plate 66, the guide posts 62 are received within guide post cavities 94 in packaging plate 66.

Connector side walls 36, 38 maintain latch member bodies 80 in a deflected state until the connector 20 abuts the carrier plate support surface 76. When the connector 20 reaches a point where it abuts plate connector mounting surface 76, the latch member bodies 80 automatically return to their undeflected state wherein the latch member retention ledges 86 slide over the connector side walls 36, 38 such that they are positioned between the plate support surface 76 and the latch member retention ledges 86, thereby securing connector 20 to packaging plate.

The connector storage assembly is designed such that, when connector 20 abuts packaging plate 66, the connector 20 is permitted a limited amount of travel along the carrier plate connector mounting surface 76 in the directions indicted by arrow "A". When the connector 20 abuts plate connector mounting surface 76, the connector resides between latch member bodies 80 and the carrier plate walls 100, 101, which cooperatively define a longitudinal channel in which the connector 20 can be moved. The latch bodies 80, carrier plate walls 100, 101 and the movement of guide posts 62 within guide post cavities 94 act to substantially restrict movement of connector 20 to the directions indicated by arrow "A". Also, as shown in FIGS. 1 and 7–9, when connector 20 abuts plate connector mounting surface 76, the third beam member engagement surface 112 is positioned opposite packaging plate engagement block 92 and first and second beam member engagement surfaces 60 and 110 are positioned opposite packaging plate engagement blocks 88 and 90.

Figure 6:
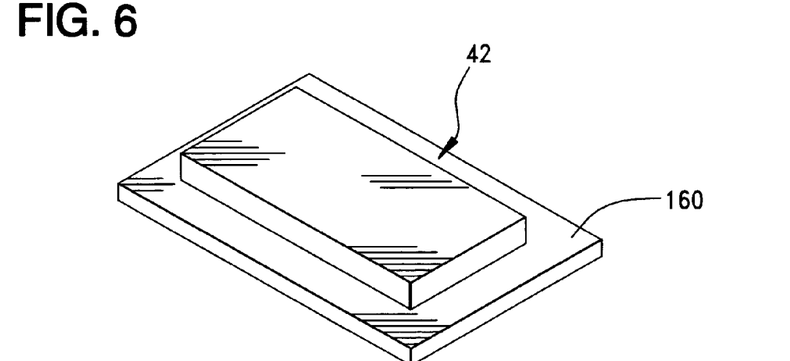
FIG. 6 is a perspective view of an electronic component configured for mounting in the connector of FIG. 1.
Figure 7:
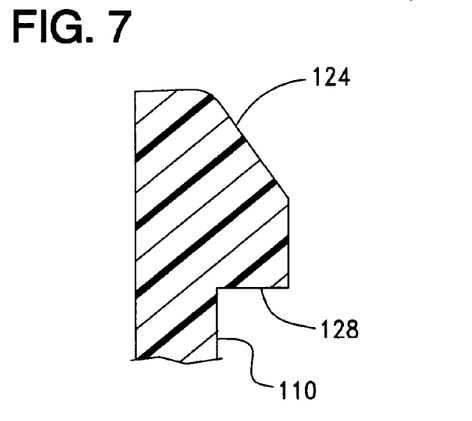
FIG. 7 is a cross-sectional view showing the retention stub and engagement surface of the second beam member.
Figure 8:
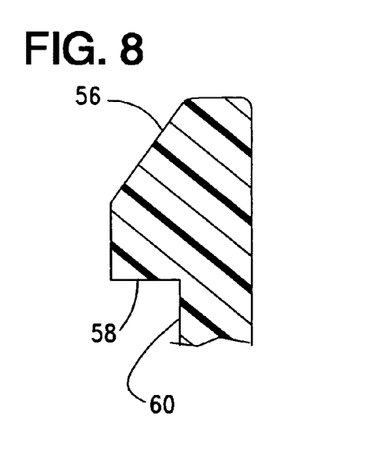
FIG. 8 is a cross-sectional view showing the retention stub and engagement surface of the first beam member.
Figure 9:
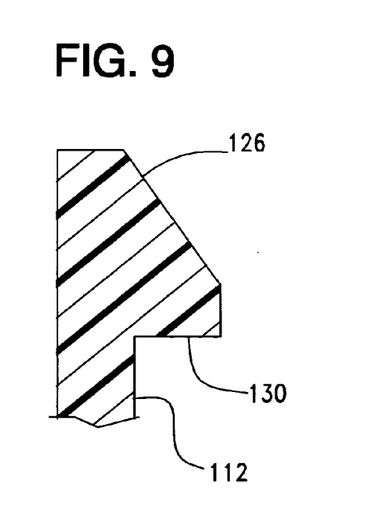
FIG. 9 is a cross-sectional view showing the retention stub and engagement surface of the third beam member.

The method of securing electrical component 42 to connector 20 will now be described. Electrical component 42 may comprise, for example, an integrated circuit device. Referring to FIG. 6, electrical component 42 includes a retention flange 160 for engagement by retention shoulders 58, 128, 130 of beam members 48, 50 and 52.

Figure 11A:
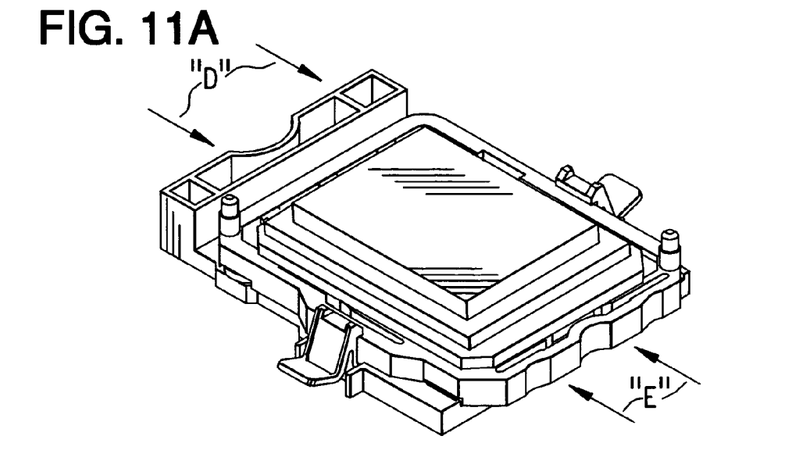
FIG. 11A is a perspective view of the packaging assembly of FIG. 2 showing the directions and points of application of forces applied to the assembly to deflect the connector beam members.

After connector 20 is secured to packaging plate 66, packaging plate 66 may be used to aid in mounting electrical component 42 to connector 20. First, electrical component 42 is laid within receptacle 40 as shown in FIG. 11A. Sloped surfaces 56, 124, 126 of retention stubs 54, 120, 122 aid in positioning electrical component 42 within receptacle 40 prior to fully seating the electrical component within the receptacle. Pressure is then applied to packaging plate first end 68 and connector housing first end wall 32 in the directions indicated by arrows "D" and "E". This pressure forces connector 20 to move relative to packaging plate 66 in the direction indicated by arrow "E". Movement of connector 20 along plate connector mounting surface 76 is guided by the latch bodies 80, packaging plate walls 100, guide posts 62 and guide post cavities 94 as described above.

Figure 10:
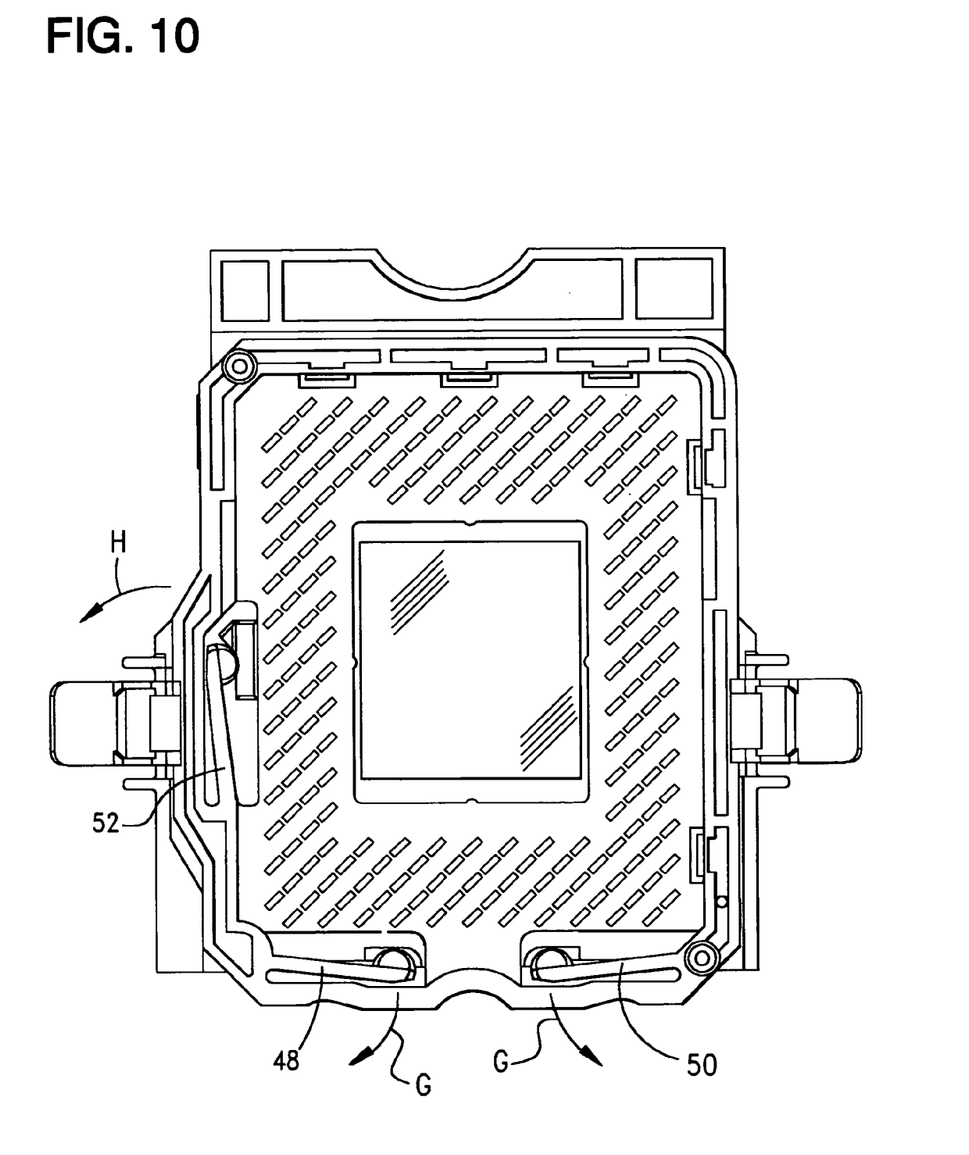
FIG. 10 is the top view of FIG. 4 showing the connector beam members in a deflected state.

Referring to FIGS. 10 and 11A, as connector 20 moves along plate connector mounting surface 76 in direction "E", the actuating members or cam blocks 88, 90 engage the first and second engagement arm surfaces 60, 110 causing the first and second beam members to resiliently deflect in the direction indicated by arrows "G". Simultaneously, the actuating member 92, especially its engagement head 192 engages the third engagement arm surface 112 in a camming action, causing it to resiliently deflect in the direction indicated by arrow "H". Deflection of the engagement arms moves them out of contact with the inner perimeter of the receptacle and so "opens" the receptacle to permit an electrical component 42 to drop into, and fully seat into, receptacle 40. This enables contact pads on electrical component 42 to come into contact with corresponding contact portions 152 of terminals 24 mounted in connector 20.

Figures 11B, 12:
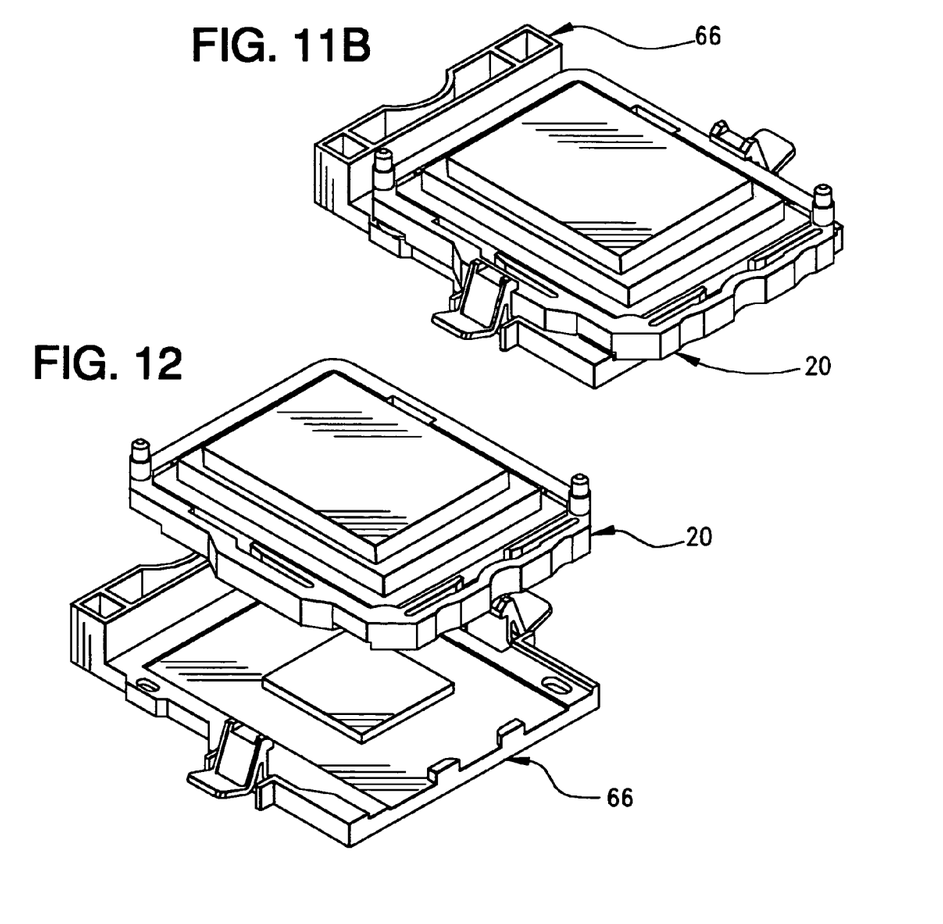
FIG. 11B is a perspective view of the packaging assembly of FIG. 2 showing the electronic component fully seated in the connector.
FIG. 12 is a perspective view showing removal of the connector from the packaging plate after the latch members have been disengaged: and, FIG. 13 is a top plan view of an alternate embodiment of socket connector and carrier member assembly constructed in accordance with the principles of the present invention.

When electrical component 42 is fully seated in receptacle 40, the pressure applied on packaging plate first end 68 and connector housing first end wall 32 is released. When this pressure is released, the outwardly deflected engagement arms 48, 50 and 52 return to their undeflected state. As they return to their undeflected state, the forces exerted by the beam member engagement surfaces on packaging plate engagement blocks 88, 90, 92 cause connector 20 to move in direction "D". As the engagement arms 48, 50 and 52 reach their undeflected states, they contact the sides 160 of the component 42.

Referring to FIGS. 2 and 12, to release the socket connector 20 from abutment with packaging plate 66, latch member actuation tabs 82 are pressed in the direction indicated by arrows "J", causing latch bodies 80 to deflect away from connector side walls 36, 38 until side walls 36, 38 are no longer positioned between latch member retention ledges 86 and plate connector mounting face 76. Connector 20 with electrical component 42 still mounted thereto may then be grasped and lifted from plate connector mounting face 76, as seen in FIG. 12.

Figure 13:
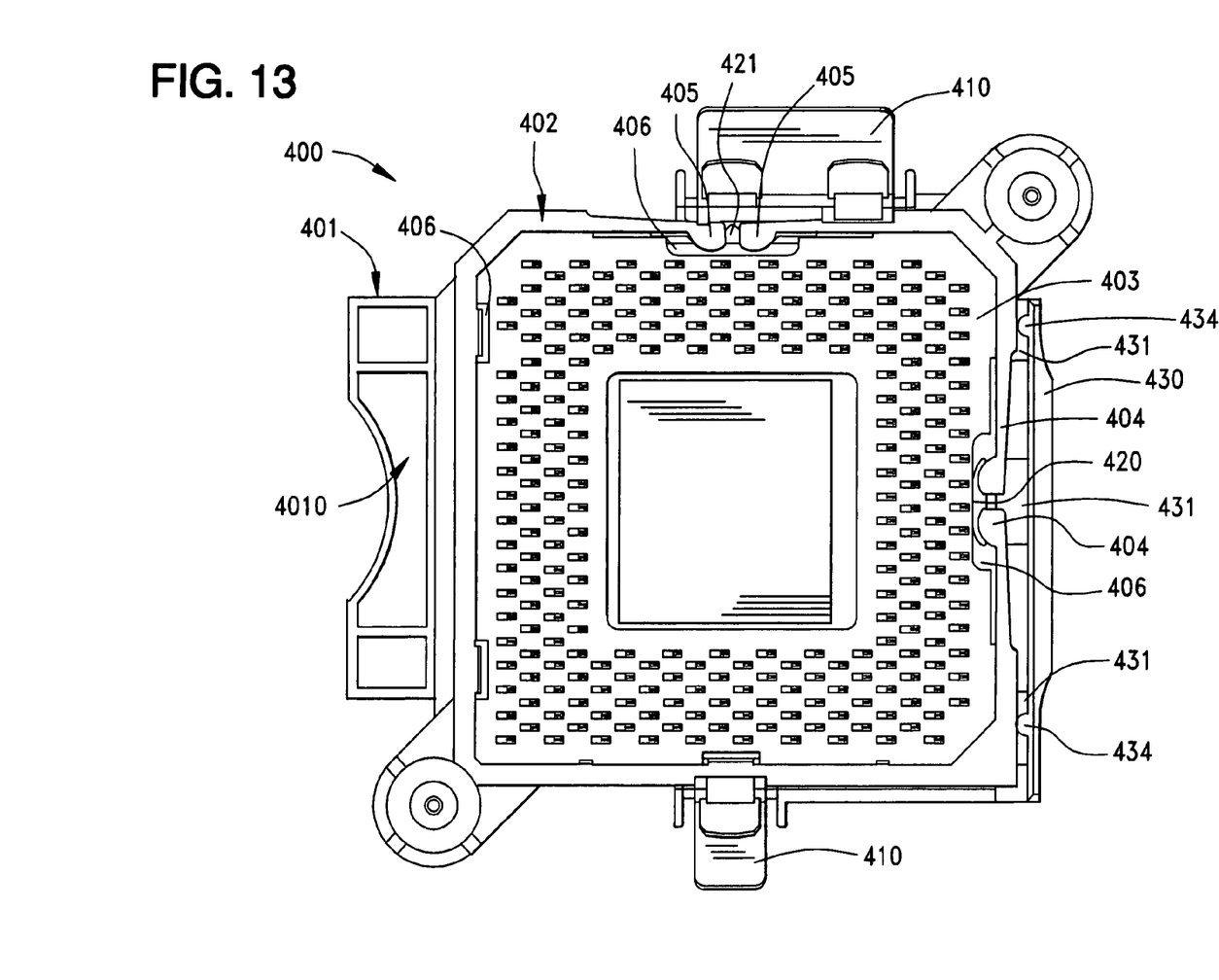

FIG. 13 illustrates another embodiment 400 of the invention that includes a carrier member 401 and a corresponding socket connector 402 with a receptacle formed therein for receiving an electronic component (not shown) therein. The socket connector 402 has two sets (shown as pairs) of engagement arms 404, 405 that are disposed on two adjacent sides, preferably on sidewalls, of the socket receptacle 403. These engagement arms 404, 405 are spaced apart from each other and have openings 406 associated with them which are formed in the base of the socket receptacle so that cam portions of the engagement arms 404, 405 may depend downwardly into contact with opposing actuating members 420, 421 in the manner shown and described above.

Whereas the prior embodiments utilized a reaction surface 1040 (FIG. 2) formed as part of the socket connector for an assembler to push against and cause the socket connector to move toward the endwall of the carrier member and to cause actuating movement to occur between the socket connector and the carrier member, this embodiment 400 utilizes a reaction surface 430 that is formed as part of a hinged member as part of the carrier member 401. This reaction surface 430 is used by an assembler to push the socket connector 402 toward the endwall 4010 and cause the engagement arms to contact the actuating members and cam outwardly. The hinged nature is accomplished by connecting the carrier base to the reaction surface 430 by extends of material and such structure may be easily accomplished by way of molding. The reaction wall 430 preferably includes contact points 434 on ends thereof that impinge upon and contact the opposing surface of the socket connector. Their contact location are preferably as illustrated in FIG. 13, in areas which are outside of, or past the area of deflection for the engagement arms 404.

It should be understood that the preceding is merely a detailed description of one embodiment of this invention and that numerous changes to the disclosed embodiment can be made in accordance with the disclosure herein without departing from the spirit or scope of the invention. The preceding description, therefore, is not meant to limit the scope of the invention. Rather, the scope of the invention is to be determined only by the appended claims and their equivalents.

The invention claimed is:

1. A connector and transport assembly for receiving an electronic component in place within the connector and for transporting the connector and component to a location for further assembly, the assembly comprising:

a connector having an insulative body including a base portion and a plurality of side walls that cooperate with the base to define a receptacle that receives an electronic component therein, the receptacle having a preselected perimeter and the connector including at least two distinct engagement arms disposed in proximity to the perimeter on different ones of the connector side walls, the engagement arms having free ends that are cantilevered out from said side walls and are deflectable between first and second operative position, said engagement arm free ends extend into said receptacle and engage an electronic component received in said receptacle and in said second operative position, said engagement arm free ends do not extend into said receptacle, said connector insulative body further including a plurality of openings disposed in said base proximate to said engagement arms, portions of said engagement arms extending into said openings; and, a carrier member for supporting said socket connector, the carrier member having a base and a first latch for retaining said socket connector on the carrier member for reciprocal movement on said carrier member, the base further including means for activating said engagement arms to said first and second operative positions, the engagement arm activating means projecting from said carrier member base into said socket connector openings adjacent said engagement arms, whereby relative movement between said socket connector and carrier member moves said engagement arms between said first and second operative positions.

2. The connector transport assembly of claim 1, wherein said socket connector includes first and second engagement arms disposed along a first side wall and a third engagement arm disposed along a second side wall of said socket connector, said first and second side walls being adjacent each other.

3. The connector transport assembly of claim 1, further including a second latch, the first and second latches being disposed on opposite sides of said carrier base.

4. The connector transport assembly of claim 3, wherein said carrier member base has a plurality of distinct sides, said carrier member base including a reaction wall disposed along a first side of said carrier member base, said first and second latches being disposed along second and third sides of said base, the first side of said base interconnecting said second and third sides of said base.

5. The connector transport assembly of claim 1, wherein said carrier member base is a plate and includes an upwardly projecting wall disposed along a first edge thereof, the wall providing a first reaction surface of said assembly.

6. The connector transport assembly of claim 1, wherein each of said engagement arms includes an enlarged head disposed at said free ends.

7. The connector transport assembly of claim 6, wherein said engagement arm free end enlarged heads extend above said engagement arm activating means.

8. The connector transport assembly of claim 7, wherein said engagement arm free end enlarged heads define a notch into which said engagement arm moving means fits when said socket connector is in place upon said carrier.

9. The connector transport assembly of claim 1, wherein said engagement arm activating means includes a pair of posts disposed along one side of said carrier base and a rail disposed along a second side of said carrier base.

10. The connector transport assembly of claim 1, wherein said carrier base includes a pair of guide slots and said socket connector body includes a pair of guide posts that extend into the guide slots, said guide posts guiding said socket connector in activating movement on said carrier.

11. The connector transport assembly of claim 1, wherein said carrier base includes a reaction wall projecting upwardly therefrom along one side of said carrier base and a hinged wall spaced apart from said reaction wall and projecting upwardly from said carrier base along an opposing side of said carrier base.

* * * * *